United States Patent
Cho et al.

(10) Patent No.: US 11,424,230 B2
(45) Date of Patent: Aug. 23, 2022

(54) PIXEL STRUCTURE AND DISPLAY DEVICE INCLUDING THE PIXEL STRUCTURE

(71) Applicant: SAMSUNG DISPLAY CO., LTD., Yongin-si (KR)

(72) Inventors: Hyunmin Cho, Yongin-si (KR); Daehyun Kim, Yongin-si (KR); Hyundeok Im, Yongin-si (KR); Jonghyuk Kang, Yongin-si (KR); Jaebyung Park, Yongin-si (KR); Jooyeol Lee, Yongin-si (KR); Chio Cho, Yongin-si (KR); Sungjin Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/507,388

(22) Filed: Jul. 10, 2019

(65) Prior Publication Data
US 2019/0333904 A1    Oct. 31, 2019

Related U.S. Application Data

(63) Continuation of application No. 16/299,735, filed on Mar. 12, 2019, which is a continuation of application
(Continued)

(30) Foreign Application Priority Data

Jun. 14, 2016   (KR) .................. 10-2016-0073837

(51) Int. Cl.
*H01L 25/16*   (2006.01)
*H01L 33/20*   (2010.01)
(Continued)

(52) U.S. Cl.
CPC ............ *H01L 25/167* (2013.01); *H01L 33/20* (2013.01); *H01L 33/38* (2013.01);
(Continued)

(58) Field of Classification Search
None
See application file for complete search history.

(56) References Cited

U.S. PATENT DOCUMENTS 5,696,389 A * 12/1997 Ishikawa ................. H01L 33/20
257/99
8,154,037 B2   4/2012 Kadotani et al.
(Continued)

FOREIGN PATENT DOCUMENTS

CN   103190004 A   7/2013
CN   105378552 A   3/2016
(Continued)

OTHER PUBLICATIONS

Office Action dated Oct. 2, 2018 by the Korean Intellectual Property Office in the examination of Korean Patent Application No. 10-2016-0073837.
(Continued)

*Primary Examiner* — Nilufa Rahim
(74) *Attorney, Agent, or Firm* — Lewis Roca Rothgerber Christie LLP

(57) ABSTRACT

A pixel structure, a display device, and a method of manufacturing a pixel structure, the pixel structure including a base substrate; at least one first electrode arranged in an upper portion of the base substrate; at least one second electrode having a circular shape extending along a circumferential direction around the at least one first electrode; and a plurality of LED elements connected to the first and second electrodes.

18 Claims, 10 Drawing Sheets

Related U.S. Application Data

No. 15/622,524, filed on Jun. 14, 2017, now Pat. No. 10,249,603.

(51) Int. Cl.
*H01L 33/38* (2010.01)
*H01L 25/075* (2006.01)
*H01L 27/15* (2006.01)
*H01L 27/12* (2006.01)

(52) U.S. Cl.
CPC ...... *H01L 25/0753* (2013.01); *H01L 27/1214* (2013.01); *H01L 27/156* (2013.01); *H01L 2933/0016* (2013.01)

(56) References Cited

U.S. PATENT DOCUMENTS

| | | |
|---|---|---|
| 9,112,112 B2 | 8/2015 | Do et al. |
| 9,324,691 B2 | 4/2016 | Jing et al. |
| 9,570,425 B2 | 2/2017 | Do |
| 9,960,205 B2 | 5/2018 | Bouvier et al. |
| 2005/0122031 A1 | 6/2005 | Itai et al. |
| 2007/0115767 A1 | 5/2007 | Nagatomi et al. |
| 2011/0019420 A1 | 1/2011 | Kadotani et al. |
| 2011/0089850 A1 | 4/2011 | Shibata et al. |
| 2011/0116252 A1 | 5/2011 | Agatani et al. |
| 2011/0254043 A1 | 10/2011 | Negishi et al. |
| 2012/0223289 A1 | 9/2012 | Gwo et al. |
| 2013/0221385 A1 | 8/2013 | Shibata et al. |
| 2014/0145237 A1 | 5/2014 | Do et al. |
| 2014/0159067 A1 | 6/2014 | Sakariya et al. |
| 2015/0260351 A1 | 9/2015 | Hiramatsu et al. |
| 2016/0148911 A1 | 5/2016 | Do |
| 2016/0211245 A1 | 7/2016 | Do |
| 2017/0069609 A1 | 3/2017 | Zhang et al. |
| 2019/0019930 A1* | 1/2019 | Do .................. H01L 33/62 |

FOREIGN PATENT DOCUMENTS

| | | |
|---|---|---|
| CN | 105900239 A | 8/2016 |
| CN | 105977272 A | 9/2016 |
| JP | 2007-164821 A | 6/2007 |
| JP | 2011-028864 A | 2/2011 |
| KR | 10-2012-0122159 A | 11/2012 |
| KR | 10-1264159 B1 | 5/2013 |
| KR | 10-1436123 B1 | 8/2014 |
| KR | 10-2015-0006798 A | 1/2015 |
| KR | 10-2016-0006339 A | 1/2016 |

OTHER PUBLICATIONS

Office Action dated Nov. 8, 2018 by the Korean Intellectual Property Office in the examination of Korean Patent Application No. 10-2016-0073837.

U.S. Office Action dated Mar. 26, 2020 issued in U.S. Appl. No. 16/299,735 (12 pages).

Final Office Action issued in U.S. Appl. No. 16/299,735 by the USPTO, dated Sep. 11, 2020, 12 pages.

U.S. Office Action dated Sep. 27, 2021, issued in U.S. Appl. No. 16/299,735 (11 pages).

U.S. Office Action from U.S. Appl. No. 16/299,735, dated Feb. 10, 2022, 11 pages.

U.S. Notice of Allowance dated Apr. 6, 2022, issued in U.S. Appl. No. 16/299,735 (9 pages).

* cited by examiner

PIXEL STRUCTURE AND DISPLAY DEVICE INCLUDING THE PIXEL STRUCTURE

CROSS-REFERENCE TO RELATED APPLICATIONS

This is a continuation application based on pending application Ser. No. 16/299,735, filed Mar. 12, 2019, which in turn is a continuation of application Ser. No. 15/622,524, filed Jun. 14, 2017, now U.S. Pat. No. 10,249,603 B2, issued Apr. 2, 2019, the entire contents of which is hereby incorporated by reference.

Korean Patent Application No. 10-2016-0073837, filed on Jun. 14, 2016, in the Korean Intellectual Property Office, and entitled: "Pixel Structure, Display Device Including the Pixel Structure, and Method of Manufacturing the Pixel Structure," is incorporated by reference herein in its entirety.

BACKGROUND

1. Field

Embodiments relate to a pixel structure, a display device including the pixel structure, and a method of manufacturing the pixel structure.

2. Description of the Related Art

A light-emitting diode (LED) element may have high photoelectric conversion efficiency, low energy consumption, and a semi-permanent lifetime, and may also be environmentally friendly. The LED element may be used for, e.g., signal lights, mobile phones, automobile headlights, outdoor electronic scoreboards, liquid crystal display (LCD) back light units (BLU), indoor/outdoor lighting devices, etc.

To utilize the LED element in a lighting device or a display, the LED element may be connected to an electrode capable of applying power to the LED element.

SUMMARY

The embodiments may be realized by providing a pixel structure including a base substrate; at least one first electrode arranged in an upper portion of the base substrate; at least one second electrode having a circular shape extending along a circumferential direction around the at least one first electrode; and a plurality of LED elements connected to the first and second electrodes.

The pixel structure may further include a driving transistor electrically connected to the at least one first electrode; and a power wiring electrically connected to the at least one second electrode.

The pixel structure may include a plurality of the first electrodes, a plurality of the second electrodes, and an electrode line connecting the plurality of the second electrodes to each other.

A separation distance between the at least one first electrode and the at least one second electrode may be about 1 μm to about 7 μm.

The at least one second electrode may include a first sub-second electrode and a second sub-second electrode, the first sub-second electrode and second sub-second electrode each having a semicircular shape, and the first sub-second electrode and the second sub-second electrode may be spaced apart from each other.

The pixel structure may further include a driving transistor electrically connected to the first electrode; and a power wiring respectively electrically connected to the first sub-second electrode and second sub-second electrode.

The pixel structure may include a plurality of the first electrodes, a plurality of the second electrodes, a first electrode line connecting a plurality of the first sub-second electrodes to each other; and a second electrode line connecting a plurality of the second sub-second electrodes to each other.

A separation distance between the first sub-second electrode and one first electrode may be different from a separation distance between the second sub-second electrode and the one first electrode.

The separation distances may each independently be about 1 μm to about 7 μm.

The embodiments may be realized by providing a display device including the pixel structure according to an embodiment; and a driving circuit connected to the pixel structure.

The embodiments may be realized by providing a method of manufacturing a pixel structure, the method including applying a plurality of LED elements and a solvent on at least one first electrode and at least one second electrode, the at least one second electrode having a circular shape extending along a circumferential direction around the at least one first electrode; respectively applying different voltages to the at least one first electrode and the at least one second electrode; and aligning the LED elements between the at least one first electrode and the at least one second electrode.

A separation distance between the at least one first electrode and the at least one second electrode may be about 1 μm to about 7 μm, and a difference between voltages applied to the at least one first electrode and the at least one second electrode may be about 10 V to about 50 V.

Applying different voltages to the at least one first electrode and the at least one second electrode may include radially generating a first electric field around the at least one first electrode and between the at least one first electrode and the at least one second electrode.

The at least one first electrode may include a plurality of first electrodes, the at least one second electrode may include a plurality of second electrodes, a same voltage may be applied to each of the first electrodes, and a same voltage may be applied to each of the second electrodes.

The at least one second electrode may include at least one first sub-second electrode and at least one second sub-second electrode, the at least one first sub-second electrode and the at least one second sub-second electrode each having a semicircular shape, and the at least one first sub-second electrode and the at least one second sub-second electrode may be spaced apart from each other.

The at least one first electrode may include a plurality of first electrodes, the at least one first sub-second electrode may include a plurality of first sub-second electrodes, the at least one second sub-second electrode may include a plurality of second sub-second electrodes, and applying different voltages to the at least one first electrode and the at least one second electrode may include applying a same voltage to each of the first electrodes, and applying a same voltage to each of the first sub-second electrodes, and applying a same voltage to each of the second sub-second electrodes, and wherein the voltage applied to the first sub-second electrodes may be different from the voltage applied to the second sub-second electrodes.

A first sub-electric field may be generated between the at least one first electrode and the at least one first sub-second electrode, a second sub-electric field may be generated between the at least one first electrode and the at least one second sub-second electrode, and a first electric field, as a combination of the first sub-electric field and the second sub-electric field, may be radially generated around the at least one first electrode.

A second electric field may be generated between one first sub-second electrode and one second sub-second electrode of an adjacent pixel structure.

A separation distance between the at least one first sub-second electrode and the at least one first electrode may be different from a separation distance between the at least one second sub-second electrode and the at least one first electrode.

The separation distances may each independently be about 1 μm to about 7 μm, a voltage difference between the first electrode and the first sub-second electrode may be about 10 V to about 50 V, and a voltage difference between the first electrode and the second sub-second electrode may be about 10 V to about 50 V.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
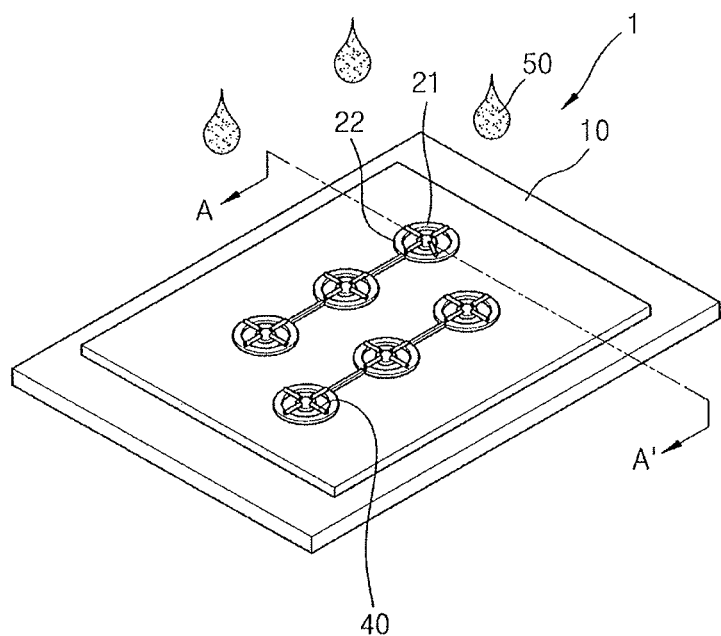
FIG. 1 illustrates a perspective view of a pixel structure according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the terms "or" and "and/or" include any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

An expression used in the singular encompasses the expression of the plural, unless it has a clearly different meaning in the context.

It will be further understood that the terms "includes," "including," "comprises," and/or "comprising" used herein specify the presence of stated features or components, but do not preclude the presence or addition of one or more other features or components.

Figure 2A:
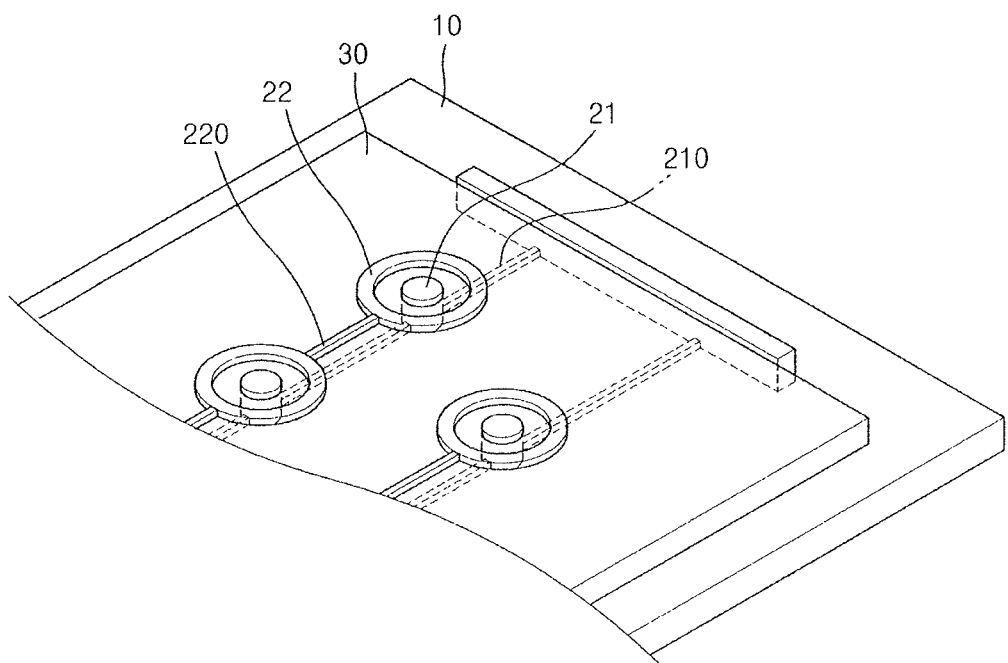
FIG. 2A illustrates an enlarged perspective view of a pixel structure according to an embodiment.
Figure 2B:
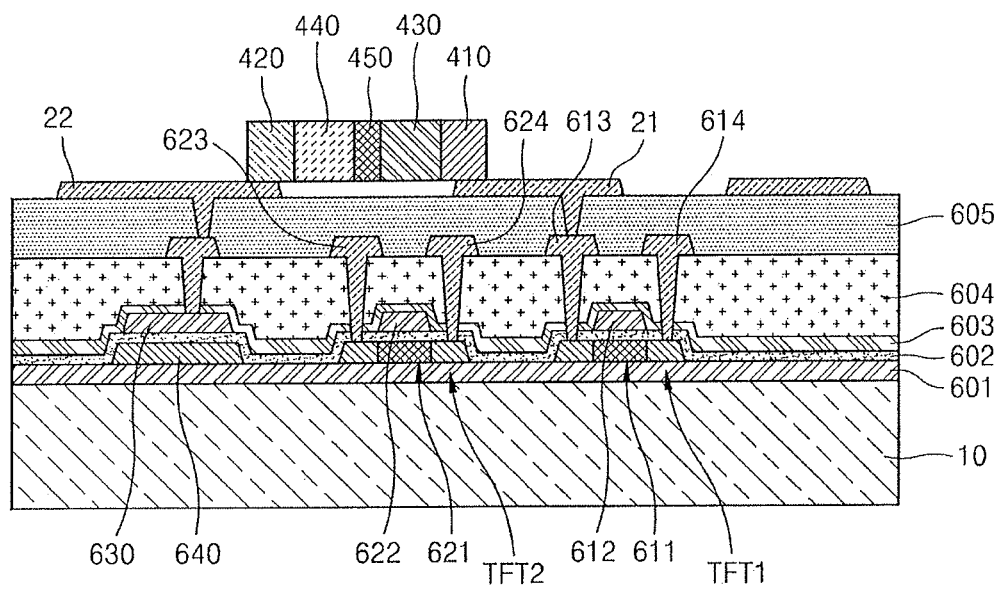
FIG. 2B illustrates a cross-sectional view taken along line A-A' of the pixel structure of FIG. 1.
Figure 3:
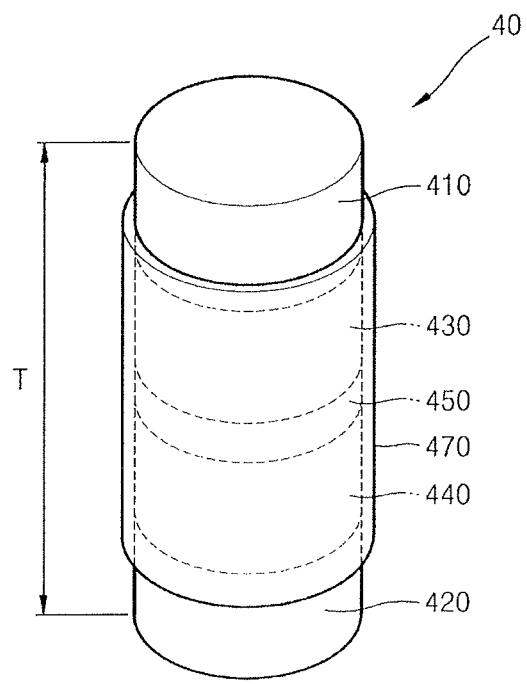
FIG. 3 illustrates a perspective view of an LED element according to an embodiment.

FIG. 1 illustrates a perspective view of a pixel structure 1 according to an embodiment. FIG. 2A illustrates an enlarged perspective view of a pixel structure according to an embodiment. FIG. 2B illustrates a cross-sectional view taken along line A-A' of the pixel structure of FIG. 1. FIG. 3 illustrates a perspective view of an, e.g., extremely small-sized, LED element 40 according to an embodiment.

Referring to FIGS. 1 to 3, the pixel structure 1 according to an embodiment may include a base substrate 10, at least one first electrode 21 arranged in an upper portion of the base substrate 10, at least one second electrode 22 arranged in an upper portion of the base substrate 10, an, e.g., extremely small-sized, LED element 40, and a solvent 50. A plurality of the pixel structures 1 may be arranged on a display area of a display device 1000 (see FIG. 7) described below. In an implementation, the solvent may be removed after forming the pixel structure, and may not remain in the pixel structure.

The base substrate 10, on which the first and second electrodes 21 and 22 are arranged, may be, e.g., a glass substrate, a crystal substrate, a sapphire substrate, a plastic substrate, or a bendable flexible polymer film. An area of the base substrate 10 according to an embodiment may vary according to an area of the first and second electrodes 21 and 22 arranged in the upper portion of the base substrate 10 and a size and the number of the LED elements 40, which will be described below, arranged between the first and second electrodes 21 and 22.

A buffer layer 601 may further be included in the upper portion of the base substrate 10. The buffer layer 601 may help reduce the possibility of and/or prevent ion impurities from being diffused into the upper surface of the base substrate 10 and may also help reduce and/or prevent moisture or outside air from permeating into the upper surface of the base substrate 10 and may flatten a surface of the same. In an implementation, the buffer layer 601 may include an inorganic material such as silicon oxide, silicon nitride, silicon oxy-nitride, aluminum oxide, aluminum nitride, titanium oxide or titanium nitride, an organic material such as polyimide, polyester or acryl, or a laminate thereof. In an implementation, the buffer layer 601 may be omitted. The buffer layer 601 may be formed by various deposition methods, e.g., a plasma enhanced chemical vapor deposition (PECVD) method, an atmospheric pressure CVD (APCVD) method, or a low pressure CVD (LPCVD) method.

The first thin film transistor TFT1 may be a driving thin film transistor for driving the LED element 40 and may include a first active layer 611, a first gate electrode 612, a first drain electrode 613, and a first source electrode 614. A first gate insulating film 602 may be interposed between the first gate electrode 612 and the first active layer 611 to insulate them from each other. The first gate electrode 612 may be formed on the first gate insulating film 602 to overlap a part of the first active layer 611.

The second thin film transistor TFT2 may include a second active layer 621, a second gate electrode 622, a second drain electrode 623, and a second source electrode 624. A first gate insulating film 602 may be interposed between the second gate electrode 622 and the second active layer 621 to insulate them from each other.

The first and second active layers 611 and 621 may be formed on the buffer layer 601. An inorganic or organic semiconductor such as amorphous-silicon or poly-silicon may be used for the first and second active layers 611 and 621. In an implementation, the first active layer 611 may be formed of an oxide semiconductor. For example, the oxide semiconductor may include an oxide of a material selected from metal elements of groups 12, 13, and 14, such as zinc (Zn), indium (In), gallium (Ga), tin (Sn), cadmium (Cd), germanium (Ge), and hafnium (Hf), and a combination thereof.

The first gate insulating film 602 may be provided on the buffer layer 601 and may cover the first and second active layers 611 and 621. The second gate insulating film 603 may cover the first and second gate electrodes 612 and 622.

Each of the first and second gate electrodes 612 and 622 may include a single film such as gold (Au), silver (Ag), copper (Cu), nickel (Ni), platinum (Pt), palladium (Pd), aluminum (Al), molybdenum (Mo) or chromium (Cr), a multilayer film, or an alloy such as Al:Nd or Mo:W.

The first and second gate insulating films 602 and 603 may include an inorganic film such as silicon oxide, silicon nitride or metal oxide, and may be formed of a single layer or a multi-layer.

An interlayer insulating film 604 may be formed on the second gate insulating film 603. The interlayer insulating film 604 may be formed of an inorganic film such as silicon oxide or silicon nitride. The interlayer insulating film 604 may include an organic film.

Each of the first drain electrode 613 and the first source electrode 614 may be formed on the interlayer insulating film 604. Each of the first drain electrode 613 and the first source electrode 614 may contact the first active layer 611 through a contact hole. Furthermore, each of the second drain electrode 623 and the second source electrode 624 may be formed on the interlayer insulating film 604, and each of the second drain electrode 623 and the second source electrode 624 may contact the second active layer 621 through the contact hole. Each of the first and second drain electrodes 613 and 623, and the first and second source electrodes 614 and 621 may include a metal, an alloy, metal nitride, conductive metal oxide, a transparent conductive material, and so on.

In an implementation, the thin film transistors TFT1 and TFT2 may have a top gate structure or a bottom gate structure in which the first gate electrode 612 is arranged under the first active layer 611 may also be possible.

A planarization film 605 may cover the thin film transistors TFT1 and TFT2 and may be provided on the interlayer insulating film 604. The planarization film 605 may flatten the interlayer insulating film 604 to improve a luminous efficiency of the LED element 40 to be formed on the planarization film 605. In an implementation, the planarization film 605 may include a through hole exposing a part of the first drain electrode 613.

The planarization film 605 may be formed of an insulator. For example, the planarization film 605 may include inorganic materials, organic materials, or a combination of organic/inorganic materials, may be formed in a structure of a monolayer or a multilayer, and may be formed via various deposition methods. In an implementation, the planarization film 605 may include at least one of a polyacrylate resin, an epoxy resin, a phenolic resin, a polyamide resin, a polyimide resin, an unsaturated polyester resin, a polyphenylene resin, a polyphenylene sulfide resin, and benzocyclobutene (BCB).

In an implementation, any one of the interlayer insulating film 604 and the planarization film 605 may be omitted.

The first electrode 21 may be arranged in an upper portion of the interlayer insulating film 605 and may be electrically connected to the LED element 40. For example, the first electrode 21 may include a plurality of the first electrodes 21 that may be arranged in the upper portion of the interlayer insulating film 605. The plurality of the first electrodes 21 may be spaced apart from each other with a prescribed gap therebetween.

Furthermore, the first electrode 21 according to an embodiment may be electrically connected to the first drain electrode 613 and may receive power. In this case, the first drain electrode 613 may be connected to the first electrode 21 via the through hole exposing a part of the first drain electrode 613.

In an implementation, the first electrode 21 according to an embodiment may include at least one metal of Al, titanium (Ti), In, Au, and Ag, or at least one transparent material of indium tin oxide (ITO), zinc oxide (ZnO):Al, and a carbon nanotube (CNT)-conductive polymer composite. When the first electrode 21 includes at least two types of materials, the first electrode 21 according to an embodiment may have a structure in which two or more materials of different types are laminated.

The second electrode 22 may be arranged in the upper portion of the interlayer insulating film 605 and may be electrically connected to the LED element 40. For example, the second electrode 22 may have a circular or annular shape (e.g., in plan view) extending along a circumferential direction around the first electrode 21. In this case, the first and second electrodes 21 and 22 may be spaced apart from each other with a prescribed gap therebetween, e.g., a first separation distance $D_1$ (see FIG. 4B) therebetween.

In an implementation, the second electrode 22 may include a plurality of the second electrodes 22 on the upper portion of the base substrate 10. The plurality of the second electrodes 22 may be spaced apart from each other with a prescribed gap therebetween. In an implementation, the second electrodes 22 may be connected to each other via an electrode line 220. In this case, a power wiring 630 may be electrically connected to the second electrode 22 via a through hole, and accordingly, the second electrodes 22 may receive an identical or same voltage power from the power wiring 630. For example, a planarization film 640 to flatten a surface of the power wiring 630 may be arranged under the power wiring 630. In an implementation, the planarization film 640 may be omitted.

In an implementation, the second electrode 22 may include at least one metal of Al, Ti, In, Au, and Ag, or at least one transparent material of ITO, ZnO:Al, and a CNT-conductive polymer composite. When the second electrode 22 includes at least two materials, the second electrode 22 according to an embodiment may have a structure in which two or more materials of different types are laminated. For example, materials included in the first and second electrodes 21 and 22 may be the same or different from each other.

In an implementation, the LED element 40, which is a light-emitting element from which light is emitted, may have various shapes, e.g., a column or rod shape or a rectangular parallelepiped. As illustrated in FIG. 3, the LED element 40 according to an embodiment may include a first electrode layer 410, a second electrode layer 420, a first semiconductor layer 430, a second semiconductor layer 440, and an active layer 450 arranged between the first and second semiconductor layers 430 and 440. For example, the first electrode layer 410, the first semiconductor layer 430, the active layer 450, the second semiconductor layer 440, and the second electrode layer 420 may be sequentially laminated along a length direction of the LED element 40. In an implementation, a length T of the LED element 40 may be, e.g., about 2 μm to 5 μm.

Each of the first and second electrode layers 410 and 420 may be an ohmic contact electrode. In an implementation, each of the first and second electrode layers 410 and 420 may be a Schottky contact electrode. Each of the first and second electrode layers 410 and 420 may include a conductive metal. For example, each of the first and second electrode layers 410 and 420 may include at least one metal of Al, Ti, In, Au, and Ag. In an implementation, each of the first and second electrode layers 410 and 420 may include identical materials. In an implementation, the first and second electrode layers 410 and 420 may include materials different from each other.

The first semiconductor layer 430 according to an embodiment may include, e.g., an n-type semiconductor layer. In an implementation, when the LED element 40 is a blue light-emitting element, the n-type semiconductor layer may include a semiconductor material having a composition formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlN, and InN, and the n-type semiconductor layer may be doped with a first conductive dopant (e.g., silicon (Si), Ge, or Sn). In an implementation, the LED element 40 may include a different type of group III-V semiconductor material in the n-type semiconductor layer when a light emission color of the LED element 40 is not blue. In an implementation, the first electrode layer 410 may not be an ohmic contact electrode or may be omitted. In an implementation, the first semiconductor layer 430 may be connected (e.g., directly connected) to the first electrode 21.

The second semiconductor layer 440 according to an embodiment may include, e.g., a p-type semiconductor layer. In an implementation, when the LED element 40 is a blue light-emitting element, the p-type semiconductor layer may include a semiconductor material having a composition formula of $In_xAl_yGa_{1-x-y}N$, e.g., one of InAlGaN, GaN, AlGaN, InGaN, AlN, and InN, and the p-type semiconductor layer may be doped with a second conductive dopant (e.g., magnesium (Mg)). In an implementation, the second electrode layer 420 may not be an ohmic contact electrode or may be omitted. In an implementation, the second semiconductor layer 440 may be connected (e.g., directly connected) to the second electrode 22.

The active layer 450 may be arranged between the first and second semiconductor layers 430 and 440, and may have, e.g., a single or multiple quantum well structure. For example, a clad layer doped with a conductive dopant may be arranged in an upper portion and/or lower portion of the active layer 450, and the clad layer doped with the conductive dopant may be realized as an AlGaN layer or InAlGaN layer. In an implementation, materials such as AlGaN or AlInGaN may also be included in the active layer 450. When an electric field is applied to the active layer 450, light may be generated due to coupling of an electronic-hole pair, and a location of the active layer 450 may vary according to types of LED elements. In an implementation, the LED element 40 may include a different type of group III-V semiconductor material in the active layer 450 when a light emission color of the LED element 40 is not blue. In an implementation, the first and second semiconductor layers 430 and 440 and the active layer 450 may be included in the LED element 40. In an implementation, the LED element 40 may further include a phosphor layer, an active layer, a semiconductor layer and/or electrode layer in upper portions and lower portions of the first and second semiconductor layers 430 and 440.

In an implementation, the LED element 40 may further include an insulating film 470 covering an outer surface of the active layer 450. For example, the insulating film 470 may cover a side surface of the active layer 450, and thus, an electrical short-circuit, which may be generated when the active layer 450 contacts the first electrode 21 or the second electrode 22, may be reduced and/or prevented. The insulating film 470 may help prevent a reduction in luminous efficiency by protecting an outer surface, which includes the active layer 450, of the LED element 40.

The solvent 50, a moving medium for activating dispersion and movement of the LED element 40 according to an embodiment, may be used. In an implementation, the solvent 50 may vaporize easily and may not physically and/or chemically damage the LED element 40. In an implementation, the solvent 50 may include, e.g., acetone, water, alcohol, or toluene.

In an implementation, the solvent 50 may be input or provided to the LED element 40 in a prescribed weight ratio. Maintaining the solvent 50 within a desired range may help reduce the possibility of and/or prevent excess amounts of the solvent 50 from being diffused to areas other than a region of the first and second electrodes 21 and 22 desired by the LED element 40, thereby helping to prevent an undesirable reduction in the number of the LED elements 40 to be mounted in a mounting region according to the first and second electrodes 21 and 22. Maintaining the solvent 50 within a desired range may help ensure that sufficient solvent is present to facilitate movement or alignment of each of the LED elements 40.

As described above, a prescribed power may be applied to the first and second electrodes 21 and 22 via the first drain electrode 613 and the power wiring 630. For example, the first drain electrode 613 may be connected to the first electrode 21 and may apply power to the same, and the power wiring 630 may be connected to the second electrode 22 and may apply power to the same. Accordingly, an electric field E may be formed between the first and second electrodes 21 and 22. Here, power having a prescribed amplitude and period may be respectively applied to the first and second electrodes 21 and 22 by respectively applying alternating current (AC) power having a prescribed amplitude and period or by repeatedly applying direct current (DC) power to the first and second electrodes 21 and 22. Hereinafter, self-alignment of the LED element 40 will be described in more detail, in which the self-alignment of the LED element 40 may be performed by the electric field E formed by applying prescribed power to the first and second electrodes 21 and 22.

Figure 4A:
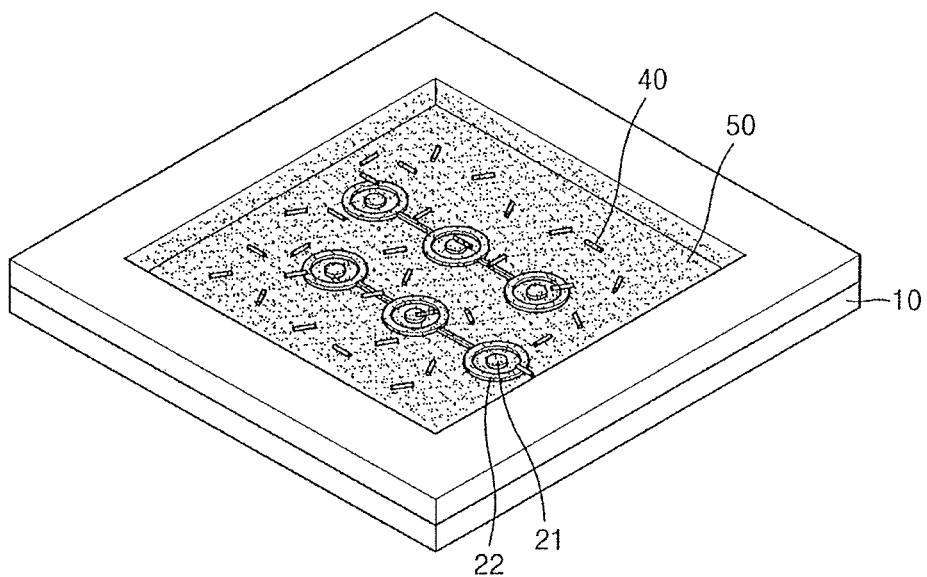
FIG. 4A illustrates a perspective view of a pixel structure according to an embodiment.
Figure 4B:
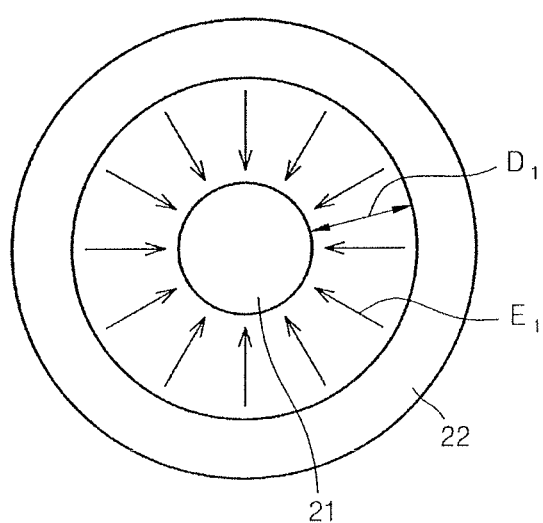
FIG. 4B illustrates an enlarged plan view of an electrode structure according to an embodiment.
Figure 4C:
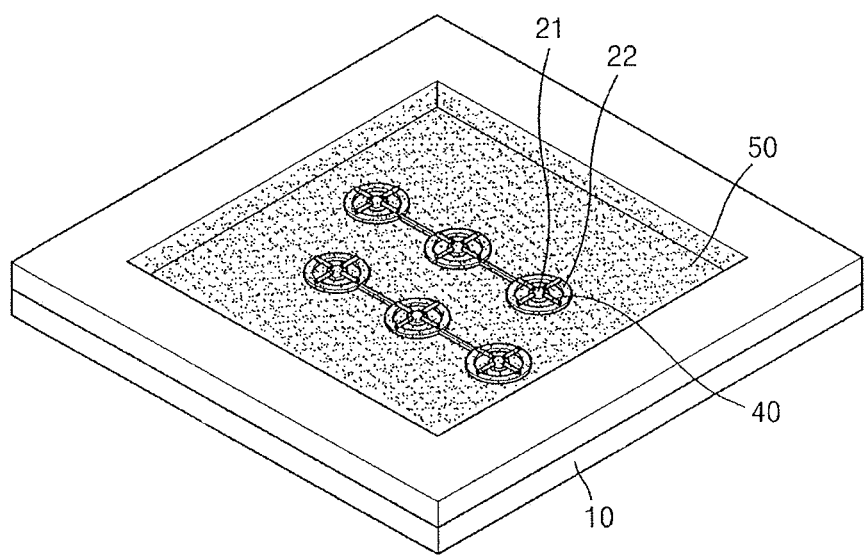
FIG. 4C illustrates a perspective view of a pixel structure according to an embodiment.
Figure 4D:
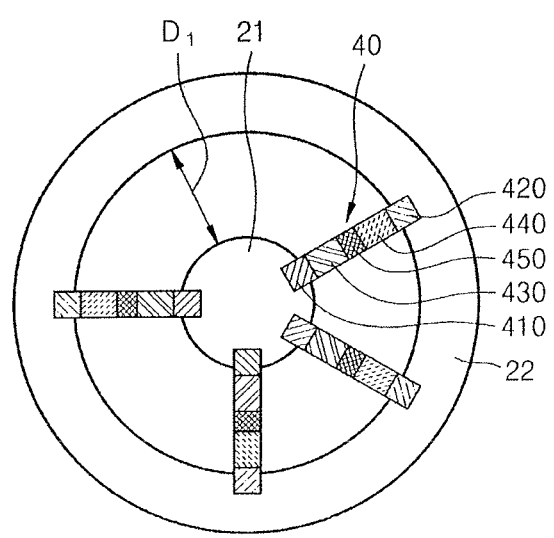
FIG. 4D illustrates an enlarged plan view of a pixel structure according to an embodiment.

FIG. 4A illustrates a perspective view of the pixel structure 1 before voltage is applied to the first and second electrodes 21 and 22, according to an embodiment. FIG. 4B illustrates an enlarged plan view of an electrode structure according to an embodiment (e.g., before voltage is applied to the first and second electrodes 21 and 22). FIG. 4C illustrates a perspective view of the pixel structure 1 after voltage is applied to the first and second electrodes 21 and 22, according to an embodiment. FIG. 4D illustrates an enlarged plan view of an electrode structure according to an embodiment (e.g., after voltage is applied to the first and second electrodes 21 and 22).

The LED element 40 according to an embodiment may be of an extremely small nano-size, and it may be difficult to physically or directly connect the LED element 40 to the first and second electrodes 21 and 22. Referring to FIG. 4A, the LED element 40 according to an embodiment may be input or provided to the first and second electrodes 21 and 22 in a solution or dispersion state where the LED element 40 is mixed or dispersed in the solvent 50. Here, when power is not supplied to the first and second electrodes 21 and 22, a plurality of the LED elements 40 may float or be dispersed in the solution, and may be arranged, e.g., only in contours of the first and second electrodes 21 and 22 or arranged adjacent to each other. In an implementation, when the LED element 40 is cylindrical or rod shaped, the LED element 40 may move on the first and second electrodes 21 and 22 while rotating due to shape characteristics. Thus, the LED element 40 may not be simultaneously connected to the first and second electrodes 21 and 22 by a self-alignment method.

Referring to FIGS. 2A, 2B, and 4B, power of different voltages may be respectively applied to the first and second electrodes 21 and 22 according to an embodiment, and thus, a prescribed electric field E may be formed between the first and second electrodes 21 and 22. For example, as described above, when the AC power or the DC power having a prescribed amplitude and period is repeatedly applied to the first and second electrodes 21 and 22 several times through the first drain electrode 613 and power wiring 630, a radial first electric field $E_1$ (according to a potential difference of the first and second electrodes 21 and 22) may be formed between the first and second electrodes 21 and 22. Here, a strength of the first electric field $E_1$ may be proportional to the potential difference of the first and second electrodes 21 and 22, and may be inversely proportional to a first separation distance $D_1$ between the first and second electrodes 21 and 22. In an implementation, the first separation distance $D_1$ between the first and second electrodes 21 and 22 may be about 1 μm to about 7 μm. In an implementation, a voltage difference between the first and second electrodes 21 and 22 may be about 10 V to about 50 V.

Referring to FIGS. 4C and 4D, when power is supplied to the first and second electrodes 21 and 22, the LED element 40 according to an embodiment may be aligned, e.g., self-aligned, between the first and second electrodes 21 and 22 by inductance of the first electric field $E_1$ which is formed by the potential difference of the first and second electrodes 21 and 22. As described above, the first electric field $E_1$ in a radiation direction around the first electrode 21 may be formed due to the potential difference of the first and second electrodes 21 and 22, and charge may be asymmetrically induced to the LED element 40 by inductance of the first electric field $E_1$. Therefore, the LED element 40 may be aligned, e.g., self-aligned, between the first and second electrodes 21 and 22 along the first electric field $E_1$. Here, connectors of the LED element 40, e.g., the first and second electrode layers 410 and 420 may be respectively arranged to simultaneously contact the first and second electrodes 21 and 22. Thus, the LED element 40 may be electrically connected to the first and second electrodes 21 and 22. The LED element 40 according to an embodiment may be aligned, e.g., self-aligned, between the first and second electrodes 21 and 22 by inductance of an electric field E (which is formed by the potential difference of the first and second electrodes 21 and 22), and the number of the LED element 40 connected to the first and second electrodes 21 and 22 may increase as strength of the electric field E is greater. In an implementation, the strength of the electric field E may be proportional to the potential difference of the first and second electrodes 21 and 22, and may be inversely proportional to the first separation distance $D_1$ between the first and second electrodes 21 and 22.

Hereinafter, in order to form pixel regions in which a plurality of the LED elements 40 are substantially mounted, an insulation process to insulate remaining regions (e.g., excluding or other than the region of the first and second electrodes 21 and 22 in which the LED elements 40 are substantially mounted) may be performed. Accordingly, the pixel structure 1 including a plurality of the first and second electrodes 21 and 22 may include a plurality of pixel regions.

A display device including a plurality of the LED elements 40 may be classified into a passive-matrix type display device and an active-matrix type display device according to a method of driving the LED element 40. For example, when the display device is an active-matrix type, the pixel structure 1 may include the first thin film transistor TFT1 as a driving transistor controlling the amount of current supplied to the LED element 40, and the second thin film transistor TFT2 as a switching transistor transmitting a data voltage to the first thin film transistor TFT1, as in the embodiment described above. An active-matrix type display device selectively turning on unit pixels in resolution, contrast ratio, and operating speed points of view is mainly used recently. In an implementation, a passive-matrix type display device turning on pixels by group may also be possible by using the electrode arrangement according to an embodiment.

As described above, the pixel structure 1 according to an embodiment may align and connect a plurality of the LED elements 40, which may be nano-sized and independently manufactured, between the first and second electrodes 21 and 22, by using the electric field E radially formed between the first and second electrodes 21 and 22. Thus, coupling the LED element 40 with the first and second electrodes 21 and 22 in one-to-one correspondence may be facilitated. Furthermore, even when a cylindrical LED element 40 is used, a defect rate of the pixel structure 1 may be minimized as the alignment between the LED element 40 and the first and second electrodes 21 and 22 may be maintained. Furthermore, it is possible to intensively arrange and connect the LED element 40 at a desired mounting region including the first and second electrodes 21 and 22 that are different from each other.

Figure 5A:
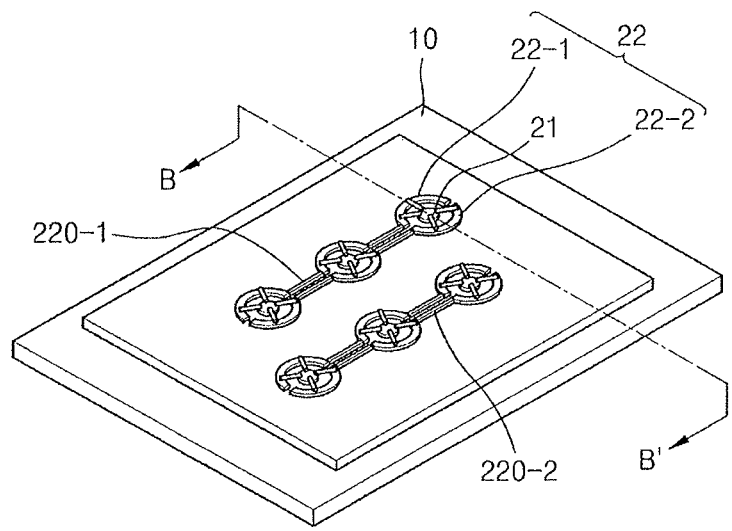
FIG. 5A illustrates a perspective view of a pixel structure according to another embodiment.
Figure 5B:
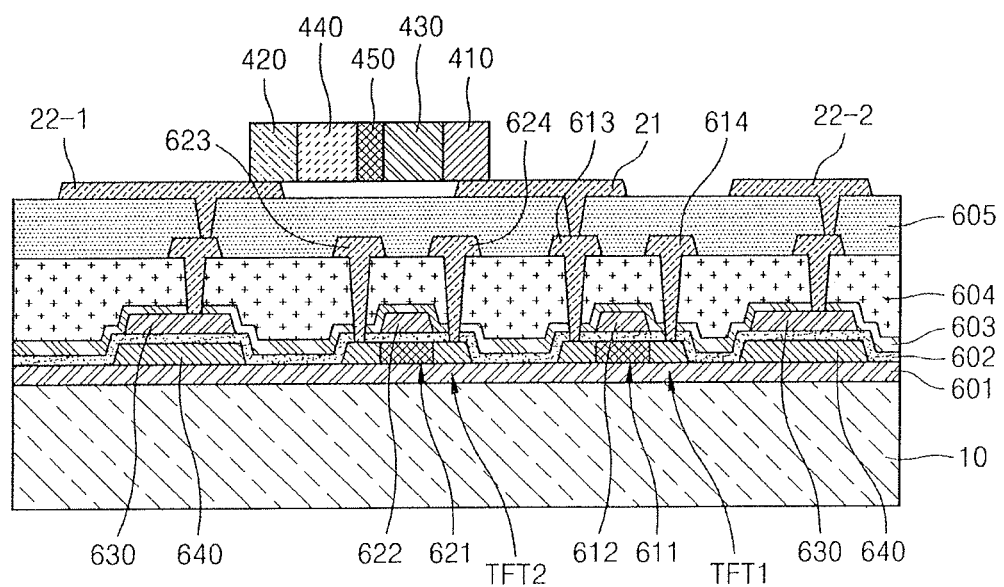
FIG. 5B illustrates a cross-sectional view taken along lines B-B' of the pixel structure of FIG. 5A.

FIG. 5A illustrates a perspective view of the pixel structure 1 according to another embodiment. FIG. 5B illustrates a cross-sectional view taken along lines B-B' of the pixel structure 1 of FIG. 5A. Referring to FIGS. 5A and 5B, the pixel structure 1 according to another embodiment may include a first electrode 21 arranged in the upper portion of the base substrate 10, a second electrode 22 (including a first sub-second electrode 22-1 and a second sub-second electrode 22-2), a plurality of the LED elements 40 arranged among the first electrode 21, the first sub-second electrode 22-1, and the second sub-second electrode 22-2, and a solvent 50 (in which the LED elements 40 are mixed or dispersed). A duplicate description will be omitted for simplicity. In an implementation, after forming the pixel structure, the solvent 50 may be removed and may not remain in the pixel structure.

The second electrode 22 may include the first sub-second electrode 22-1 and the second sub-second electrode 22-2 spaced apart from each other. The first sub-second electrode 22-1, and the second sub-second electrode 22-2 may be arranged in the upper portion of the interlayer insulating film 605 and may be electrically connected to the LED element 40. For example, each of the first sub-second electrode 22-1, and the second sub-second electrode 22-2 may have a semicircular shape extending along a circumferential direction around the first electrode 21.

In an implementation, the first sub-second electrode 22-1 and the second sub-second electrode 22-2 may include a plurality of the first sub-second electrodes 22-1 and a plurality of the second sub-second electrodes 22-2 arranged in the upper portion of the interlayer insulating film 605 to be spaced apart from each other with a prescribed gap therebetween. In an implementation, the first sub-second electrodes 22-1 may be connected to each other via a first electrode line 220-1. As illustrated in FIG. 5B, the power wiring 630 may be electrically connected to each of the first sub-second electrodes 22-1 and the second sub-second electrodes 22-2 via a through hole. Accordingly, power of a first voltage may be supplied to the first sub-second electrodes 22-1 and power of a second voltage may be supplied to the second sub-second electrodes 22-2. A size or voltage of the first voltage may be different from that of the second voltage.

In an implementation, the first sub-second electrodes 22-1 and the second sub-second electrodes 22-2 may each independently include at least one metal of Al, Ti, In, Au, and Ag, or at least one transparent material of ITO, ZnO:Al, and a CNT-conductive polymer composite. When each of the first sub-second electrodes 22-1 and the second sub-second electrodes 22-2 includes at least two materials, each of the first sub-second electrodes 22-1 and the second sub-second electrodes 22-2 may have a structure in which two or more materials of different types are laminated. In an implementation, the first sub-second electrodes 22-1 and the second sub-second electrodes 22-2 may include different materials as well as an identical material.

Figure 6A:
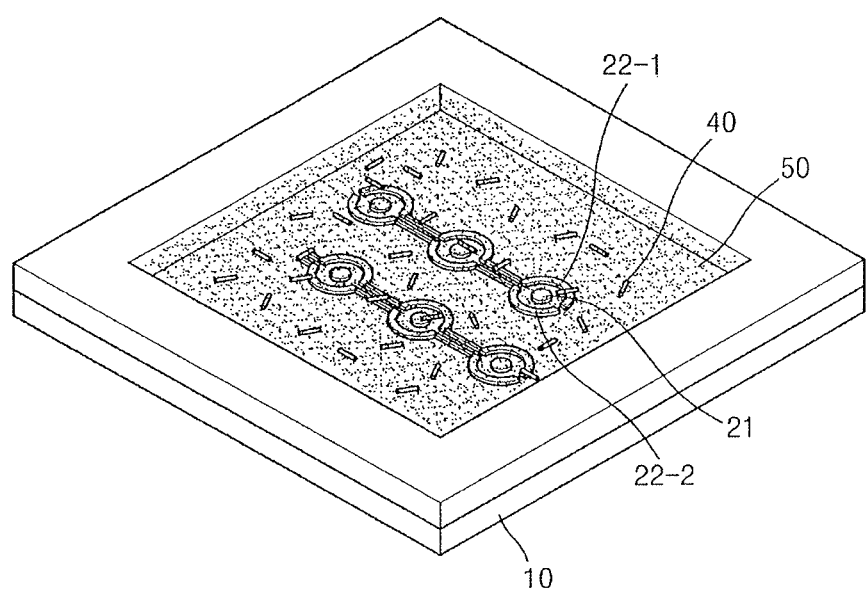
FIG. 6A illustrates a perspective view of a pixel structure according to another embodiment.
Figure 6B:
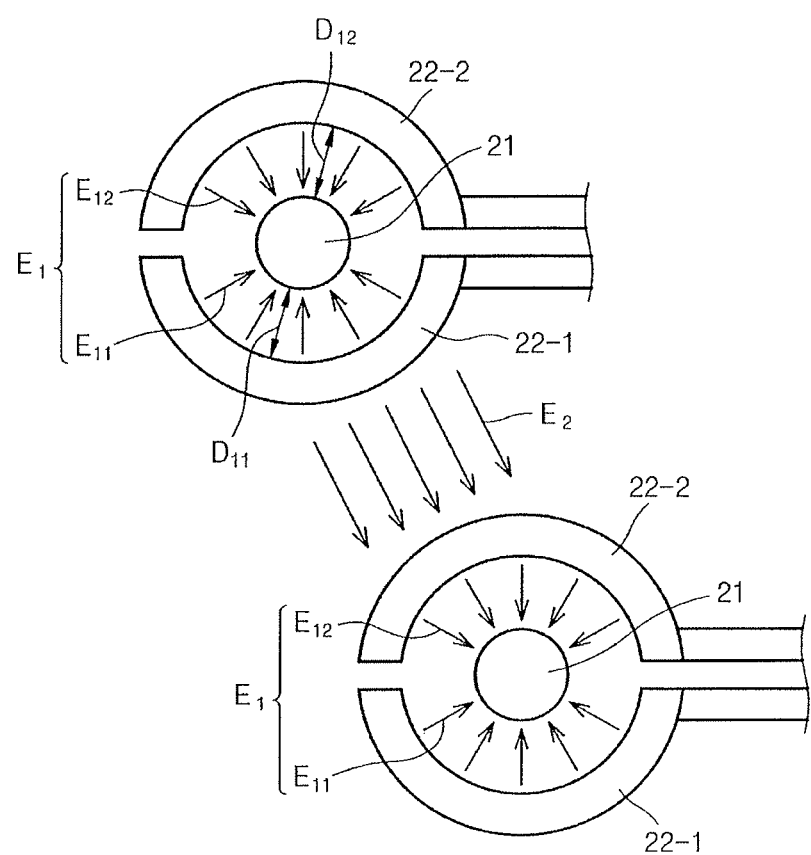
FIG. 6B illustrates an enlarged plan view of an electrode structure according to another embodiment.
Figure 6C:
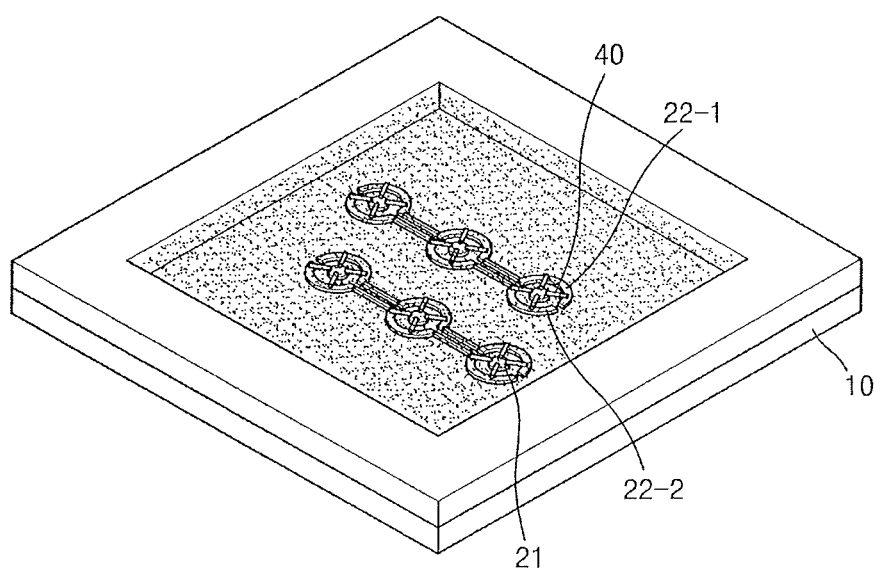
FIG. 6C illustrates a perspective view of a pixel structure according to another embodiment.
Figure 6D:
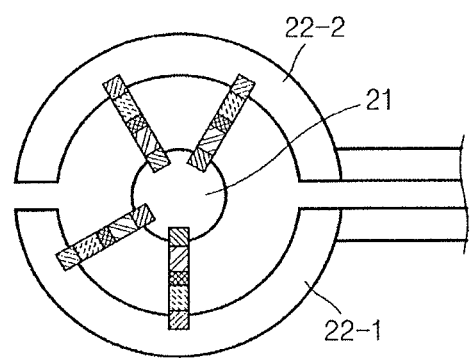
FIG. 6D illustrates an enlarged plan view of a pixel structure according to another embodiment.
Figure 6D:
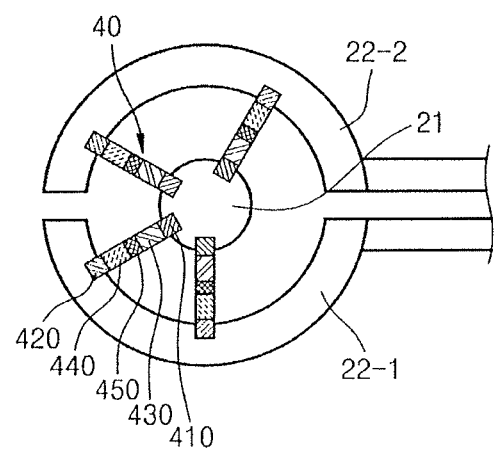

FIG. 6A illustrates a perspective view of the pixel structure 1 before voltage is applied to the first and second electrodes 21 and 22, according to another embodiment. FIG. 6B illustrates an enlarged plan view of the pixel structure 1 according to the embodiment. FIG. 6C illustrates a perspective view of the pixel structure 1 after voltage is applied to the first and second electrodes 21 and 22, according to the embodiment. FIG. 6D illustrates an enlarged plan view of the pixel structure 1 according to the embodiment.

As illustrated in FIGS. 4A to 4D, the pixel structure 1 according to an embodiment may align and connect a plurality of the LED elements 40, which may be nano-sized and independently manufactured, between the first and second electrodes 21 and 22, by using the electric field E radially formed between the first and second electrodes 21 and 22. Therefore, when the first electric field $E_1$ is radially formed between the first and second electrodes 21 and 22 as illustrated in FIG. 4C, the LED element 40 may be aligned between the first and second electrodes 21 and 22, and a separate electric field E may not be formed between a plurality of the second electrodes 22 (e.g., adjacent second electrodes 22) because the same voltage may be applied to the second electrodes 22. Accordingly, the LED element 40 between the second electrodes 22 may be arranged in contours of the second electrodes 22 or arranged adjacent to each other.

Referring to FIG. 6A, the LED element 40 according to an embodiment may be input or provided to the first electrode 21, the first sub-second electrode 22-1, and the second sub-second electrode 22-2 in a solution or dispersion state where the LED element 40 is mixed or dispersed in the solvent 50. When power is not supplied to the first electrode 21, the first sub-second electrode 22-1, and the second sub-second electrode 22-2, a plurality of the LED elements 40 may float or otherwise be dispersed in the solution and may be arranged, e.g., only in contours of the first electrode 21, the first sub-second electrode 22-1, and the second sub-second electrode 22-2, or may be arranged, e.g., adjacent to one another. Referring to FIG. 6B, power may be applied to each of the first electrode 21, the first sub-second electrode 22-1, and the second sub-second electrode 22-2. Thus, a prescribed electric field E may be formed between the first electrode 21 and the first sub-second electrode 22-1, between the first electrode 21 and the second sub-second electrode 22-2, and between the first sub-second electrode 22-1 and the second sub-second electrode 22-2. For example, as described above, when the AC power or the DC power having a prescribed amplitude and period is repeatedly applied to the first electrode 21, the first sub-second electrode 22-1, and the second sub-second electrode 22-2 several times, a first sub-electric field $E_{11}$ according to a potential difference of the first electrode 21 and the first sub-second electrode 22-1 may be formed between the first electrode 21 and the first sub-second electrode 22-1, a second sub-electric field $E_{12}$ according to the potential difference of the first electrode 21 and the second sub-second electrode 22-2 may be formed between the first electrode 21 and the second sub-second electrode 22-2, and a second electric field $E_2$ according to a potential difference of the first sub-second electrode 22-1 and the second sub-second electrode 22-2 may be formed between the first sub-second electrode 22-1 and the second sub-second electrode 22-2. For example, the second electric field $E_2$ may be formed between the first sub-second electrode 22-1 of one pixel and the second sub-second electrode 22-2 of a different, adjacent pixel.

Referring to FIGS. 6C and 6D, the LED element 40 according to an embodiment may be aligned, e.g., self-aligned, between the first electrode 21 and the first sub-second electrode 22-1 by inductance of the first sub-electric field $E_{11}$ which is formed by the potential difference of the first electrode 21 and the first sub-second electrode 22-1. According to an embodiment, as described above, when power having a prescribed voltage difference is supplied to the first electrode 21 and the first sub-second electrode 22-1, the first sub-electric field $E_{11}$ may be formed between the first electrode 21 and the first sub-second electrode 22-1 by the potential difference of the first electrode 21 and the first sub-second electrode 22-1. Therefore, charge may be asymmetrically induced to the LED element 40 by the inductance of the first sub-electric field $E_{11}$, and the LED element 40 may be aligned, e.g., self-aligned, between the first electrode 21 and the first sub-second electrode 22-1 along the first sub-electric field $E_{11}$. In an implementation, connectors of the LED element 40, e.g., the first and second electrode layers 410 and 420, may be respectively arranged to simultaneously respectively contact the first electrode 21 and the first sub-second electrode 22-1. Thus, the LED element 40 may be electrically connected to the first electrode 21 and the first sub-second electrode 22-1.

The LED element 40 may be aligned, e.g., self-aligned, between the first electrode 21 and the second sub-second electrode 22-2 by inductance of the second sub-electric field $E_{12}$ (which is formed by the potential difference of the first electrode 21 and the second sub-second electrode 22-2). The formation of the second sub-electric field $E_{12}$ by the first electrode 21 and the second sub-second electrode 22-2, and the alignment, e.g., self-alignment, of the LED element 40 which is generated by charge asymmetrically induced to the LED element 40 by the inductance of the second sub-electric field $E_{12}$ may be substantially the same as the alignment, e.g., self-alignment, method of the LED element 40 by the first electrode 21 and the first sub-second electrode 22-1, and a repeated description may be omitted for simplicity.

In an implementation, as described above, the first sub-electric field $E_{11}$ (formed by the potential difference of the first electrode 21 and the first sub-second electrode 22-1 and the second sub-electric field $E_{12}$ formed by the potential difference of the first electrode 21 and the second sub-second electrode 22-2 may be radially formed around the first electrode 21. Voltages of power applied to each of the first sub-second electrode 22-1 and the second sub-second electrode 22-2 may be different from each other, and the first sub-electric field $E_{11}$ and the second sub-field $E_{12}$ may be different from each other as long as a separation distance $D_{11}$ between the first electrode 21 and the first sub-second electrode 22-1 and a separation distance $D_{12}$ between the first electrode 21 and the second sub-second electrode 22-2 are the same as each other. Therefore, in order to make the first sub-electric field $E_{11}$ and the second sub-electric field $E_{12}$ (formed among the first electrode 21, the first sub-second electrode 22-1, and the second sub-second electrode 22-2) uniform, the separation distance $D_{11}$ and the separation distance $D_{12}$ may be formed differently, e.g., may be different distances. For example, when a first voltage of power applied to the first sub-second electrode 22-1 is greater than a second voltage of power applied to the second sub-second electrode 22-2, the separation distance $D_{11}$ may be larger than the separation distance $D_{12}$. Thus, the first electric field $E_1$ (e.g., a combination of the first sub-electric field $E_{11}$ and the second sub-electric field $E_{12}$) may be uniformly formed. In an implementation, the separation distance $D_{11}$ and the separation distance $D_{12}$ may be the same as each other. For example, when length T of the LED element 40 is 2 μm to 5 μm as illustrated in FIG. 3, the separation distance $D_{11}$ and the separation distance $D_{12}$ may be each about 1 μm to about 7 μm, and a voltage difference between the first electrode 21 and the first sub-second electrode 22-1 and between the first electrode 21 and the second sub-second electrode 22-2 may be about 10 V to about 50 V.

In an implementation, when the LED element 40 is arranged between the first sub-second electrode 22-1 and the second sub-second electrode 22-2, the LED element 40 may move to a side of the first sub-second electrode 22-1 or the second sub-second electrode 22-2 by inductance of the second electric field $E_2$ (which is formed by the potential difference of the first sub-second electrode 22-1 and the second sub-second electrode 22-2. In an implementation, when a voltage higher than that of the second sub-second electrode 22-2 is applied to the first sub-second electrode 22-1, and a voltage is not applied to the first electrode 21, the first sub-electric field $E_{11}$ may be formed between the first electrode 21 and the first sub-second electrode 22-1, the second sub-electric field $E_{12}$ may be formed between the first electrode 21 and the second sub-second electrode 22-2, and the second electric field $E_2$ (toward the second sub-second electrode 22-2 from the first sub-second electrode 22-1 may be formed. In an implementation, the, e.g., strength of the, first sub-electric field $E_{11}$ may be greater than the second sub-electric field $E_{12}$, and the, e.g., strength of the, second sub-electric field $E_{12}$ may be greater than the second electric field $E_2$.

For example, when the LED element 40 is arranged between the first sub-second electrode 22-1 and the second sub-second electrode 22-2, a charge may be asymmetrically induced to the LED element 40 by the inductance of the second electric field $E_2$ (formed between the first sub-second electrode 22-1 and the second sub-second electrode 22-2). The LED element 40 arranged between the first sub-second electrode 22-1 and the second sub-second electrode 22-2 may move to the second sub-second electrode 22-2 along a direction of the second electric field $E_2$. Afterwards, the LED element 40 may be aligned, e.g., self-aligned, between the first sub-second electrode 22-1 and the second sub-second electrode 22-2 by the second sub-electric field $E_{12}$ which is formed by the first electrode 21 and the second sub-second electrode 22-2.

As described above, the pixel structure 1 according to an embodiment may remove a region where the electric fields E are balanced with each other by adapting the first sub-second electrode 22-1 and the second sub-second electrode 22-2 (to which different voltages are respectively applied). Thus, all the LED elements 40 arranged in pixels may be aligned and/or connected to one another among the first electrode 21, the first sub-second electrode 22-1, and the second sub-second electrode 22-2.

Figure 7:
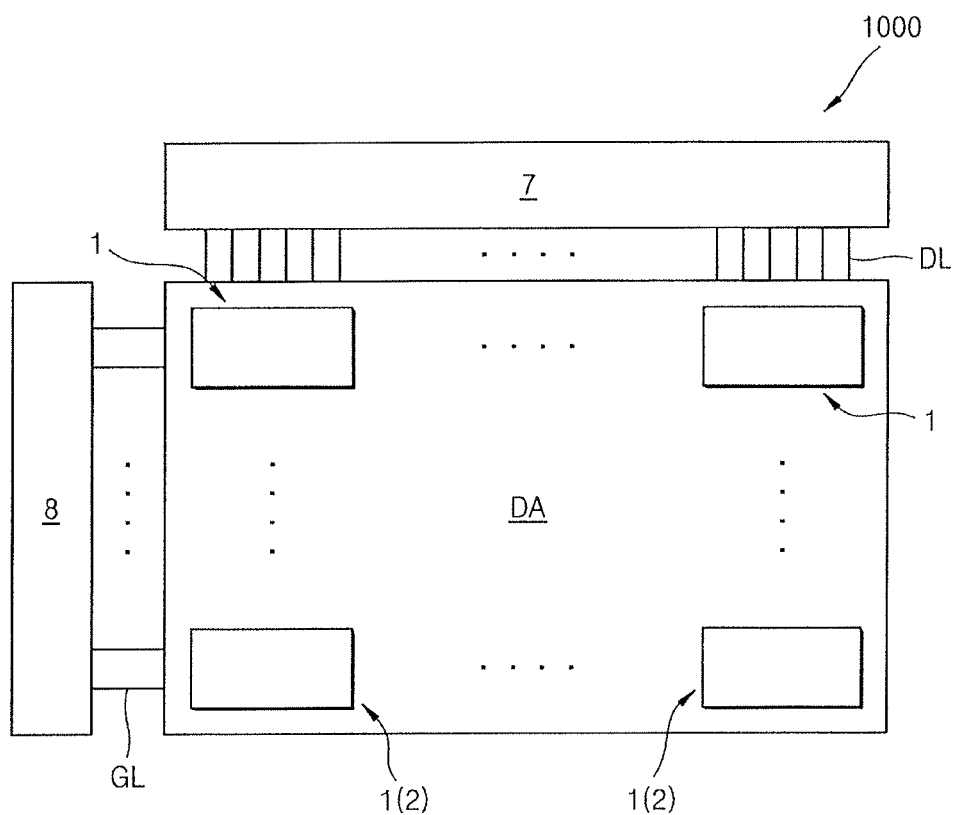
FIG. 7 illustrates a conceptual diagram of a display device according to an embodiment.

FIG. 7 illustrates a conceptual diagram of a display device 1000 according to an embodiment.

Referring to FIG. 7, the display device 1000 may include a plurality of the pixel structures 1 according to the embodiments described above, and driving circuits connected to the pixel structures 1.

The pixel structures 1 may be arranged in a display area DA of the display device 1000. The driving circuits may be arranged in a non-display area arranged in a contour of the display area DA of the display device 1000. The driving circuits may include a data driving circuit 7 and a gate driving circuit 8.

In an implementation, a length of a side of each of the pixel structures 1 may be about 600 μm or less. In an implementation, when the pixel structures 1 form sub pixels, the length of a side of each of the pixel structures 1 may be about 200 μm or less. A side of each of the pixel structures 1 may be a short side of each of the pixel structures 1. In an implementation, sizes of the pixel structures 1 may change according to sizes and the number of required pixels of the display device 1000.

The data driving circuit 7 may include a plurality of source drive integrated circuits (IC) and may drive data lines DL. The gate driving circuit 8 may include at least one gate drive IC and may supply a scan pulse to gate lines GL.

By way of summation and review, an arrangement of the LED element and the electrode may be considered in relation to an objective of use, reduction of a space for the electrode, and a method of manufacturing the electrode.

A method of arranging the LED element and the electrode may include a method of directly growing the LED element on the electrode and a method of arranging the LED element on the electrode after independently growing the LED element. In the latter case, a general three-dimensional (3D) LED element may be connected to the electrode after being erected in an upright position. It may be difficult to erect upright the LED element in an upright position on the electrode when the LED element has an extremely small nano-size.

The embodiments may provide pixel structures, display devices including the pixel structure, and methods of manufacturing the pixel structures, whereby an abnormal misalignment of an extremely small nano-sized light-emitting diode (LED) element may be reduced and/or prevented by aligning and connecting a plurality of the LED elements, which are independently manufactured, between two electrodes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pixel structure comprising:
   a base substrate;
   a first electrode on the base substrate, the first electrode being circular;
   a second electrode having a circular shape of a substantially uniform width between an inner edge and an outer edge, and extending in a circumferential direction around the first electrode, the inner edge being defined by an inner radius, and the outer edge being defined by an outer radius; and
   a plurality of LED elements having a rod shape that are connected to the first electrode and the second electrode, and that are arranged to extend radially outward from the first electrode and to extend in different directions so that long axes of the plurality of LED elements have a radial arrangement,
   wherein the first and second electrodes are concentric.

2. The pixel structure of claim 1, wherein a first end of each of the plurality of LED elements is located on the first electrode and a second end is located on the second electrode.

3. The pixel structure of claim 2, wherein the first end of each of the plurality of LED elements is directly connected to the first electrode and the second end is directly connected to the second electrode.

4. The pixel structure of claim 1, wherein two LED elements adjacent to each other from among the plurality of LED elements are arranged in a first direction and a second direction intersecting the first direction, respectively, wherein the first direction and the second direction form an acute angle.

5. The pixel structure of claim 1, wherein imaginary lines extending from different directions in which the plurality of LED elements are arranged respectively meet at a virtual contact point, wherein the virtual contact point is located in the first electrode.

6. The pixel structure of claim 1, wherein the second electrode is annularly provided with a closed curve.

7. The pixel structure of claim 6, wherein the first electrode has a circular shape and is located at a center of the second electrode.

8. The pixel structure of claim 1, further comprising:
   a driving transistor electrically connected to the first electrode; and
   a power wire electrically connected to the second electrode.

9. The pixel structure of claim 1, wherein the first electrode and the second electrode are plural, the pixel structure further comprising an electrode line connecting the plurality of second electrodes.

10. The pixel structure of claim 1, wherein a separation distance between the first electrode and the second electrode is 1 μm or more and 7 μm or less.

11. The pixel structure of claim 1, wherein the second electrode comprises a first sub-electrode and a second sub-electrode having a semicircular shape,
   wherein the first sub-electrode and the second sub-electrode are separated and arranged to be spaced apart from each other,
   wherein a first one of the LED elements is connected to the first electrode and connected to the first sub-electrode, and
   wherein a second one of the LED elements is connected to the first electrode and connected to the second sub-electrode.

12. The pixel structure of claim 11, further comprising:
   a driving transistor electrically connected to the first electrode; and
   a power wire electrically connected to the first sub-electrode and the second sub-electrode.

13. The pixel structure of claim 11, wherein the first sub-electrode and the second sub-electrode are plural, the pixel structure further comprising:
   a first electrode line connecting the plurality of first sub-electrodes; and
   a second electrode line connecting the plurality of second sub-electrodes.

14. The pixel structure of claim 13, wherein a first separation distance between the first sub-electrode and the first electrode is different from a second separation distance between the second sub-electrode and the first electrode.

15. The pixel structure of claim 14, wherein the first separation distance and the second separation distance are 1 μm or more and 7 μm or less.

16. The pixel structure of claim 11, wherein a first end of each of the plurality of LED elements is located on the first electrode and a second end is located on the first sub-electrode or the second sub-electrode.

17. The pixel structure of claim 16, wherein the first end of each of the plurality of LED elements is directly connected to the first electrode and the second end is directly connected to the first sub-electrode or the second sub-electrode.

18. A display device comprising:
    the pixel structure of claim 1; and
    a driving circuit connected to the pixel structure.

* * * * *